(12) United States Patent
Moon et al.

(10) Patent No.: US 7,745,242 B2
(45) Date of Patent: Jun. 29, 2010

(54) METHOD FOR FABRICATING LIQUID CRYSTAL DISPLAY DEVICE

(75) Inventors: Kyo Ho Moon, Daegu-si (KR); Tae Ung Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/171,095

(22) Filed: Jul. 10, 2008

(65) Prior Publication Data

US 2009/0017569 A1     Jan. 15, 2009

(30) Foreign Application Priority Data

Jul. 11, 2007     (KR) ...................... 10-2007-0069491

(51) Int. Cl.
   *H01L 21/00* (2006.01)
(52) U.S. Cl. .............................. 438/30; 257/57; 257/72; 257/257; 257/368; 257/392
(58) Field of Classification Search .................... 438/22, 438/29, 30
   See application file for complete search history.

(56) References Cited

U.S. PATENT DOCUMENTS

| | | | | |
|---|---|---|---|---|
| 6,255,130 | B1 * | 7/2001 | Kim | 438/30 |
| 2002/0117691 | A1 * | 8/2002 | Choi et al. | 257/225 |
| 2003/0007108 | A1 * | 1/2003 | Hwang et al. | 349/43 |
| 2004/0046905 | A1 * | 3/2004 | Hong et al. | 349/43 |
| 2004/0238886 | A1 * | 12/2004 | Lee et al. | 257/347 |
| 2005/0231671 | A1 * | 10/2005 | Jun et al. | 349/139 |
| 2006/0003479 | A1 * | 1/2006 | Park et al. | 438/30 |
| 2006/0145154 | A1 * | 7/2006 | Choi et al. | 257/57 |
| 2006/0163741 | A1 * | 7/2006 | Bae et al. | 257/763 |
| 2006/0209223 | A1 * | 9/2006 | Choi et al. | 349/43 |
| 2007/0188671 | A1 * | 8/2007 | Hwang et al. | 349/43 |
| 2007/0197019 | A1 * | 8/2007 | Kang et al. | 438/620 |
| 2008/0227245 | A1 * | 9/2008 | Lee et al. | 438/160 |

* cited by examiner

*Primary Examiner*—Ha Tran T Nguyen
*Assistant Examiner*—Shantanu C Pathak
(74) *Attorney, Agent, or Firm*—Birch, Stewart, Kolasch & Birch, LLP (57) ABSTRACT

A method for fabricating a liquid crystal display device is disclosed. The method includes forming a first conductive layer on an insulating substrate, forming a first insulating layer, a second conductive layer, and a third conductive layer on the first conductive layer, patterning the second conductive layer and the third conductive layer, such that the third conductive layer is located on a partial region of the second conductive layer, forming a second insulating layer on the patterned third conductive layer, forming a first contact hole to expose the first conductive layer by patterning the first and second insulating layers, and a second contact hole to expose the third conductive layer by patterning the second insulating layer, and forming a fourth conductive layer to connect the first and third conductive layers with each other by way of the first and second contact holes.

4 Claims, 6 Drawing Sheets

METHOD FOR FABRICATING LIQUID CRYSTAL DISPLAY DEVICE

This application claims the benefit of the Korean Patent Application No. 10-2007-0069491, filed on Jul. 11, 2007, which is hereby incorporated by reference as if fully set forth herein.

BACKGROUND OF THE INVENTION

1. Field of the Invention

The present invention relates to a method for fabricating a liquid crystal display device, and more particularly, to a method for fabricating a liquid crystal display device, which can improve step coverage of an insulating layer included in a substrate in which a plurality of conductive layers and insulating layers are stacked, thereby preventing wire breakage in the conductive layer.

2. Discussion of the Related Art

Liquid crystal display devices display an image by regulating light transmissivity of liquid crystal, having a dielectric anisotropy property, using an electric field. Such a liquid crystal display device is mainly constructed in such a way that a color filter substrate, formed with a color filter array, and a thin-film transistor substrate, formed with a thin-film transistor array, are bonded to each other with liquid crystal interposed therebetween. The thin-film transistor substrate is provided with a plurality of pixel electrodes arranged in a matrix, a data signal being applied to the respective pixel electrodes individually. Also, the thin-film transistor substrate is provided with thin-film transistors to drive the plurality of pixel electrodes individually, gate lines to control the thin-film transistors, and data lines to apply a data signal to the thin-film transistors.

The thin-film transistor substrate is configured in such a way that a plurality of conductive layers and insulating layers are stacked. For example, the thin-film transistor substrate is configured in such a way that a first conductive layer, in which the gate lines, gate electrodes of the thin-film transistors, etc. are formed, a second conductive layer, in which the data lines, source electrodes and drain electrodes of the thin-film transistors, etc. are formed, and a third conductive layer, in which the pixel electrodes, etc. are formed, are stacked with insulating layers interposed therebetween.

The above-described thin-film transistor substrate includes a plurality of jumpers, which must connect the first and second conductive layers with each other by means of bridge electrodes formed of the third conductive layer. The bridge electrodes connect the first and second conductive layers with each other by way of first contact holes, which penetrate at least two insulating layers to expose the first conductive layer to the outside, and by way of second contact holes, which penetrate at least one insulating layer to expose the second conductive layer to the outside.

However, a semiconductor layer is further formed below the second conductive layer. As a result of stacking the second conductive layer over the semiconductor layer, the insulating layer formed on the second conductive layer exhibits poor step coverage at a stepped portion between the semiconductor layer and the second conductive layer. In this case, when the third conductive layer is formed on the insulating layer exhibiting poor step coverage, the third conductive layer has a problem of wire breakage.

SUMMARY OF THE INVENTION

Accordingly, the present invention is directed to a method for fabricating a liquid crystal display device that substantially obviates one or more problems due to limitations and disadvantages of the related art.

An object of the present invention is to provide a liquid crystal display device and a method for fabricating the liquid crystal display device, which can improve step coverage of an insulating layer formed on a second conductive layer, thereby preventing wire breakage in a third conductive layer that connects the second conductive layer with a first conductive layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a liquid crystal display device comprises: forming a first conductive layer on an insulating substrate; forming a first insulating layer, a second conductive layer, and a third conductive layer on the first conductive layer; patterning the second conductive layer and the third conductive layer, such that the third conductive layer is located on a partial region of the second conductive layer and a partial region of the third conductive layer adjacent to the first conductive layer is removed; forming a second insulating layer on the patterned third conductive layer; forming a first contact hole to expose the first conductive layer by patterning the first and second insulating layers, and a second contact hole to expose the third conductive layer by patterning the second insulating layer; and forming a fourth conductive layer to connect the first and third conductive layers with each other by way of the first and second contact holes.

A jumper, including the fourth conductive layer to connect the first and third conductive layers with each other, may be formed on a thin-film transistor substrate including an image display part constituted of a plurality of pixel regions and a drive circuit to drive the image display part, the image display part may include pixel electrodes formed on the respective pixel regions, thin-film transistors connected with the pixel electrodes, gate lines to control the thin-film transistors, and data lines to supply data to the thin-film transistors, and the drive circuit may include a gate drive circuit to drive the gate lines.

The first conductive layer may be a gate conductive layer formed on an insulating substrate, the second conductive layer may be a semiconductor layer formed on the first insulating layer, the third conductive layer may be a drain conductive layer formed on the semiconductor layer, and the fourth conductive layer may be a transparent conductive layer formed on the drain conductive layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Now, a method for fabricating a liquid crystal display device according to the present invention will be described with reference to the accompanying drawings.

Figure 1:
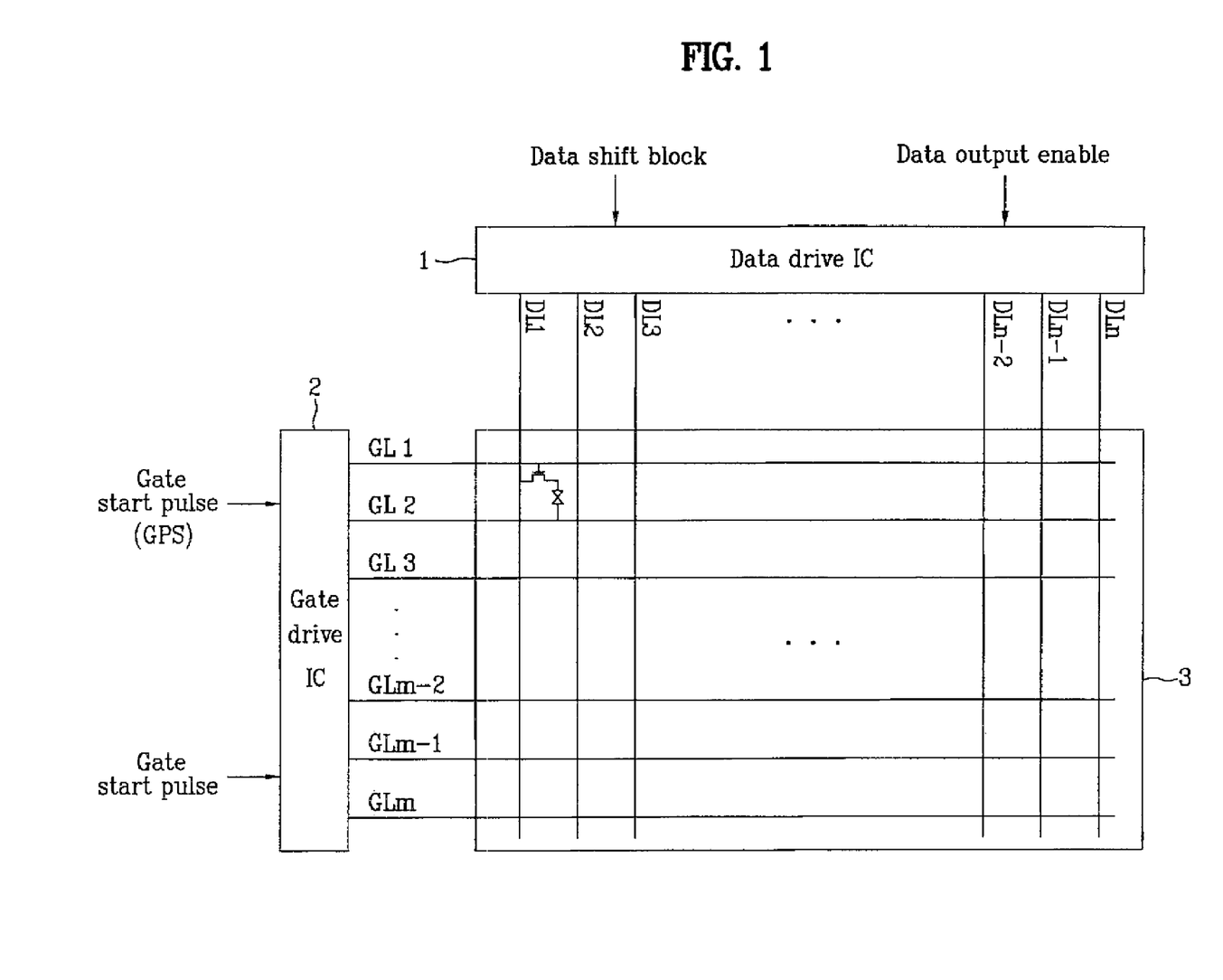
FIG. 1 is a plan view schematically illustrating a liquid crystal display device according to an embodiment of the present invention.

FIG. 1 is a plan view schematically illustrating a liquid crystal display device according to an embodiment of the present invention.

The liquid crystal display device shown in FIG. 1 includes an image display part 3, a gate drive Integrated Circuit (IC) 2 to sequentially drive gate lines GL1 to GLm of the image display part 3, and a data drive IC 1 to supply data to data lines DL1 to DLn of the image display part 3.

The gate lines and data lines of the image display part 3 intersect each other, and Thin-Film Transistors (hereinafter, referred to as "TFTs") and pixel electrodes are provided in pixel regions defined by the intersecting configuration.

The TFT supplies a data signal, from any one of the data lines, to the corresponding pixel electrode, in response to a scan signal from any one of the gate lines. The pixel electrode controls liquid crystal in the unit of pixels by generating an electric field together with a common electrode of a color filter substrate according to the supplied data signal, thereby displaying an image.

The gate drive IC 2 includes a plurality of stages including shift registers to drive the respective gate lines, thereby sequentially driving the gate lines in response to a gate start pulse.

The data drive IC 1 includes shift registers and latches, and shifts a data bit in response to a data shift clock and supplies data for a single line to the data lines simultaneously in response to a data output enable signal.

If the gate start pulse is supplied to the gate drive IC 2, the gate drive IC 2 sequentially supplies a gate drive pulse to the m gate lines, thereby sequentially driving the m gate lines. Thereby, the TFTs are sequentially driven per one gate line, supplying data signals to the pixels per one gate line in sequence.

Figure 2:
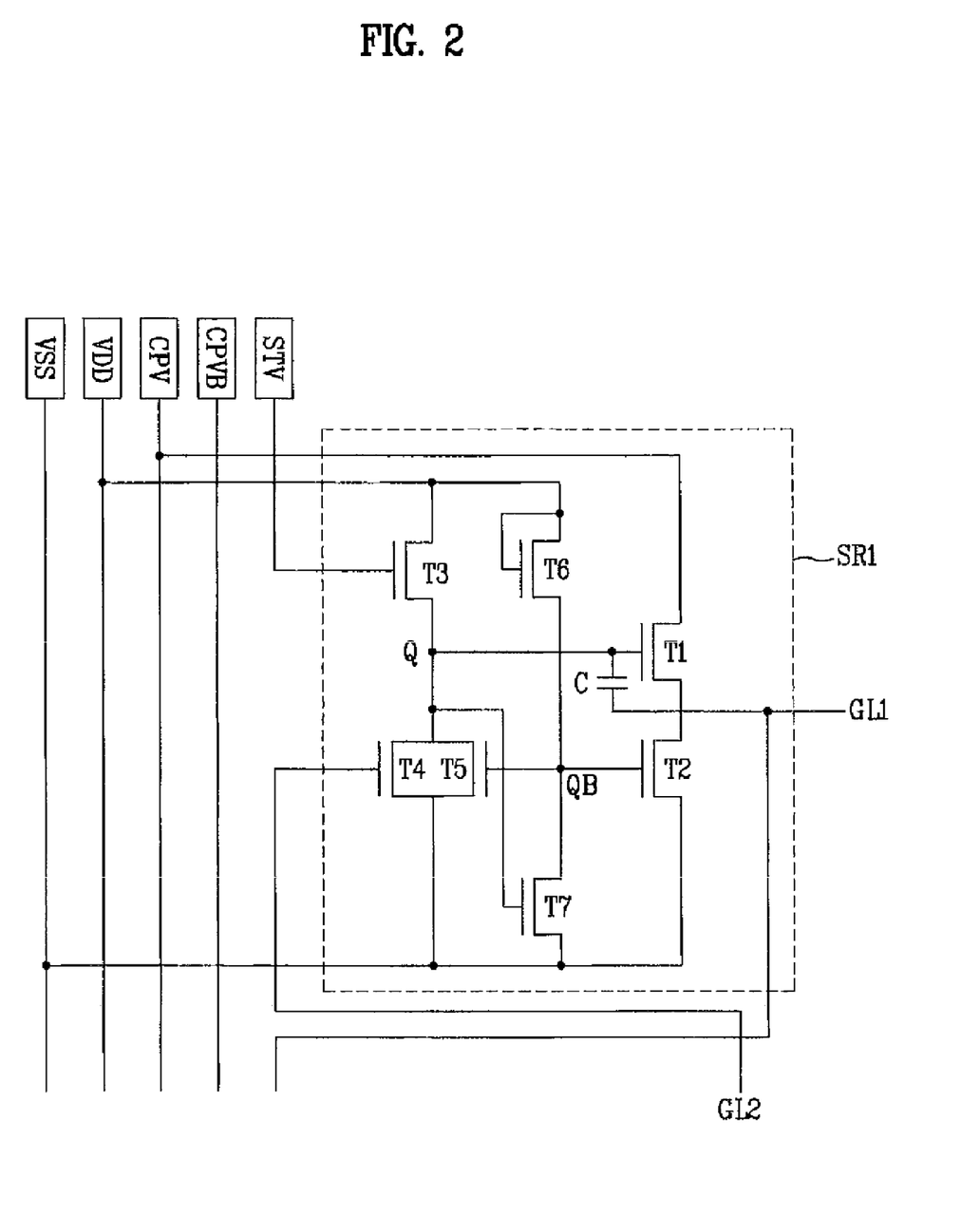
FIG. 2 is a detailed circuit diagram illustrating any one of a plurality of shift registers mounted in a gate drive IC of FIG. 1.

The gate drive IC shown in FIG. 1 includes a plurality of shift registers, and FIG. 2 is a detailed circuit diagram illustrating any one of the plurality of shift registers.

The shift register SR1 shown in FIG. 2 includes an output buffer, which consists of a first thin-film transistor T1 as a pull-up transistor to output a clock CPV to the first gate line GL1 under the control of a Q-node and a second thin-film transistor T2 as a pull-down transistor to output a low potential voltage VSS to the first gate line GL1 under the control of a QB-node, and a controller which consists of third to seventh thin-film transistors T3 to T7 to control the Q-node and the QB-node. Although the first to seventh thin-film transistors T1 to T7 may be formed into an N-type or P-type, they are mainly formed into an N-type together with the TFTs of the image display part 3.

The third thin-film transistor T3 free-charges the Q-node with a high potential voltage VDD in response to a start pulse STV. The free-charged Q-node is bootstrapped via coupling action of a capacitor C which responds to the clock CPV, allowing a high voltage of the clock CPV to be outputted as a scan signal of the first gate line GL1 via the first thin-film transistor T1. Subsequently, the fourth thin-film transistor T4 and the fifth thin-film transistor T5 allow the Q-node to be discharged to the low potential voltage VSS, in response to a scan signal of the second gate line GL2 and in response to the QB-node, respectively. The sixth thin-film transistor T6 is connected, in a forward diode manner, to a high potential voltage VDD supply line, so as to charge the QB-node with the high potential voltage VDD. The seventh thin-film transistor T7 allows the QB-node to be discharged to the low potential voltage VSS in response to the Q-node. When the Q-node is discharged to the low potential voltage VSS through the fourth and fifth thin-film transistors T4 and T5, the seventh thin-film transistor T7 is turned off, charging the QB-node with the high potential voltage VDD.

Thereby, the second thin-film transistor T2 is turned on, allowing the scan signal of the first gate line GL1 to be discharged to the low potential voltage VSS. The second thin-film transistor T2 maintains a turned-on state until the start pulse STV is fed to the third thin-film transistor T3, allowing the first gate line GL1 to maintain the low potential voltage VSS.

In the above-described liquid crystal display device according to the present invention, the gate drive IC, which includes the plurality of thin-film transistors, is mounted in the thin-film transistor substrate of a liquid crystal panel using amorphous silicon. Since the gate drive IC is formed via plural mask processes together with the image display part of the thin-film transistor substrate, the thin-film transistor substrate has a configuration in which at least three conductive layers are stacked with insulating layers interposed therebetween. A plurality of jumpers, such as the Q-node, in which different conductive layers are connected with each other via bridge electrodes, are present in the gate drive IC. Specifically, the gate drive IC contains a plurality of jumpers in which a gate conductive layer and a source or drain conductive layer are stacked with a gate insulating layer interposed therebetween and are connected with each other via a bridge electrode that is formed of a transparent conductive layer on a pasivation layer.

Figure 3:
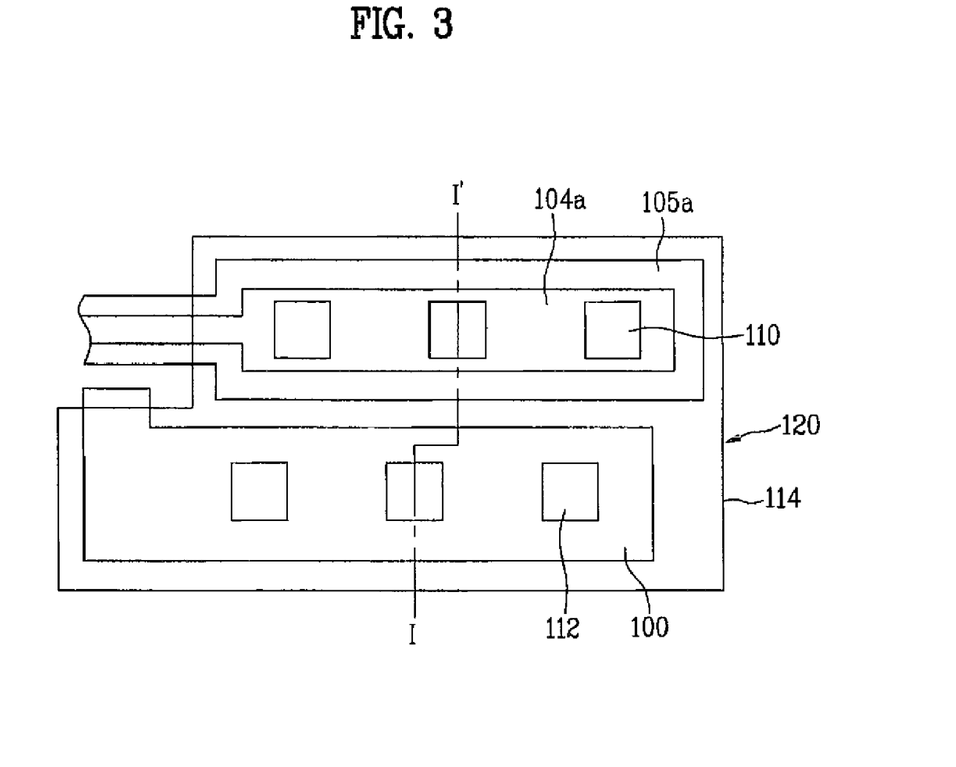
FIG. 3 is an enlarged plan view illustrating a jumper of different conductive layers included in the gate drive IC of FIG. 1.
Figure 4A:
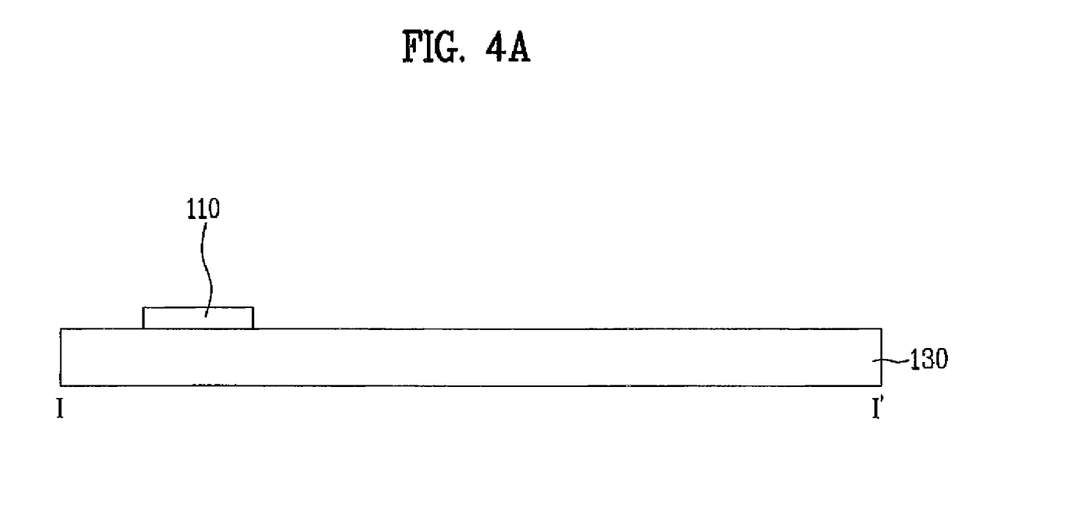
FIGS. 4A to 4F are a flow chart illustrating a process for forming a jumper according to the present invention.
Figure 4B:
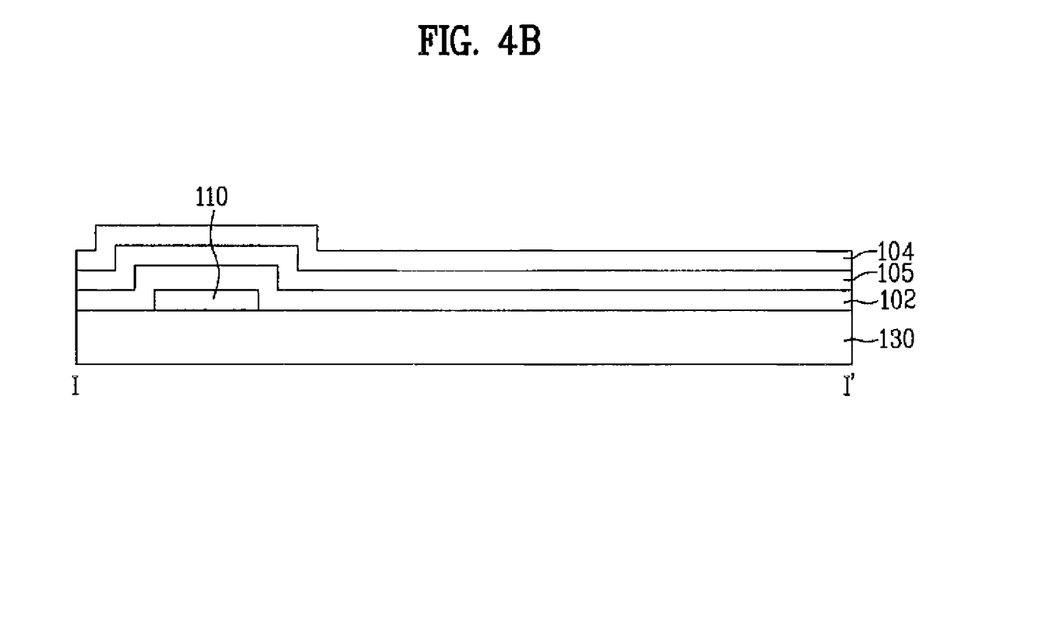
Figure 4C:
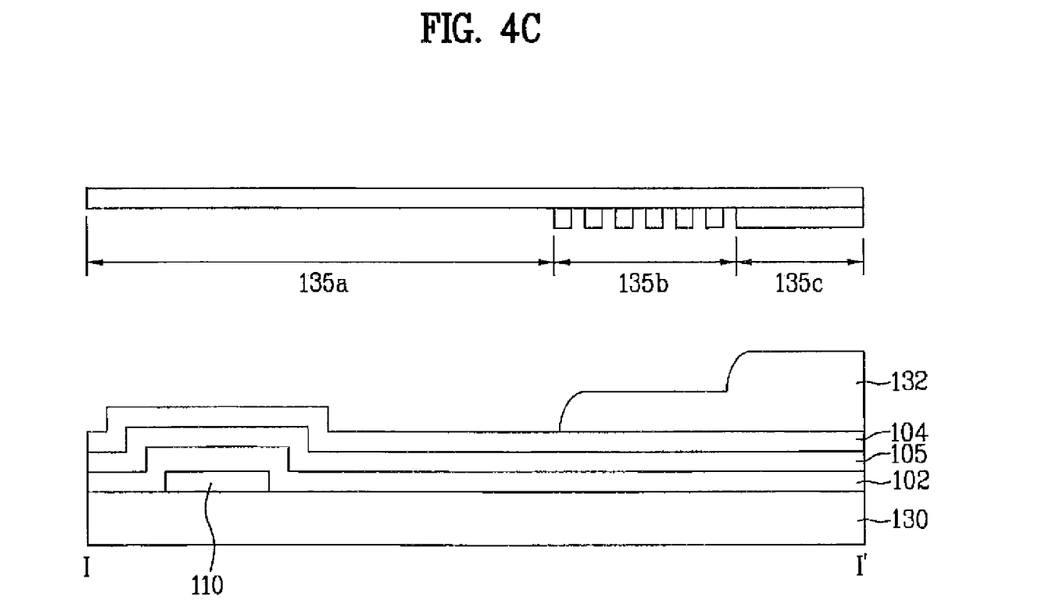
Figure 4D:
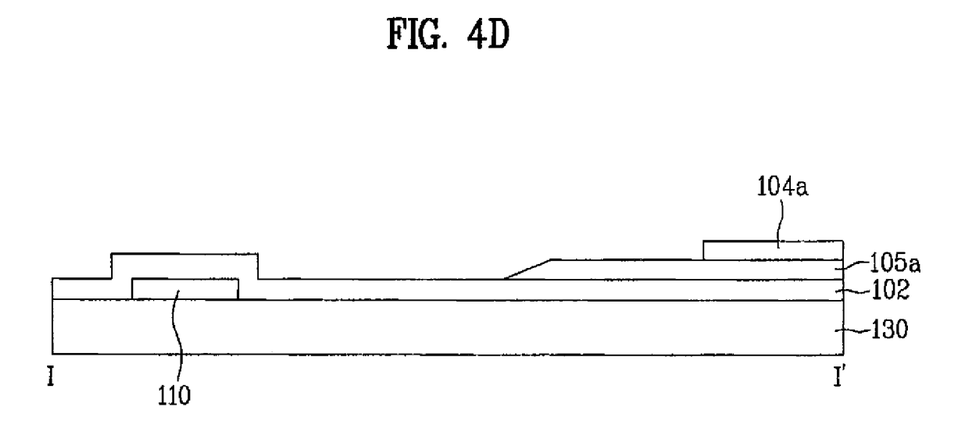
Figure 4E:
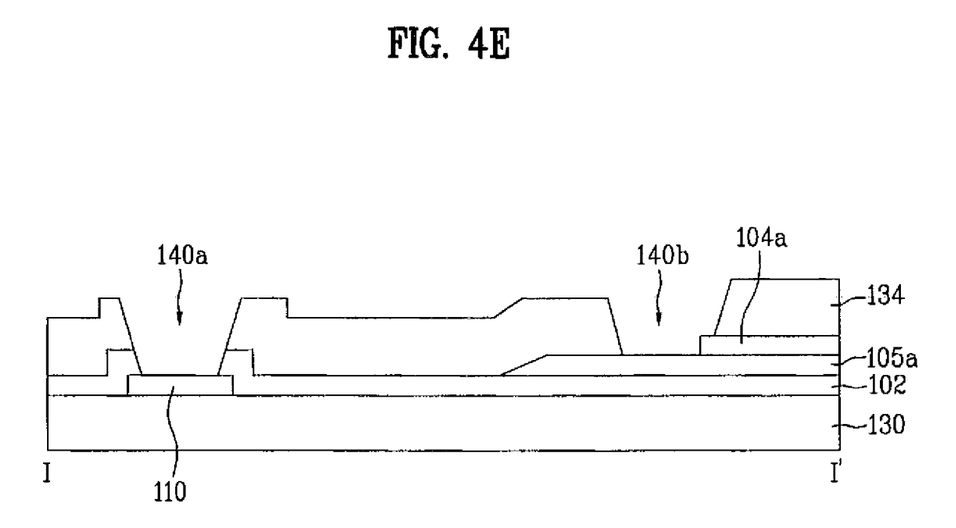
Figure 4F:
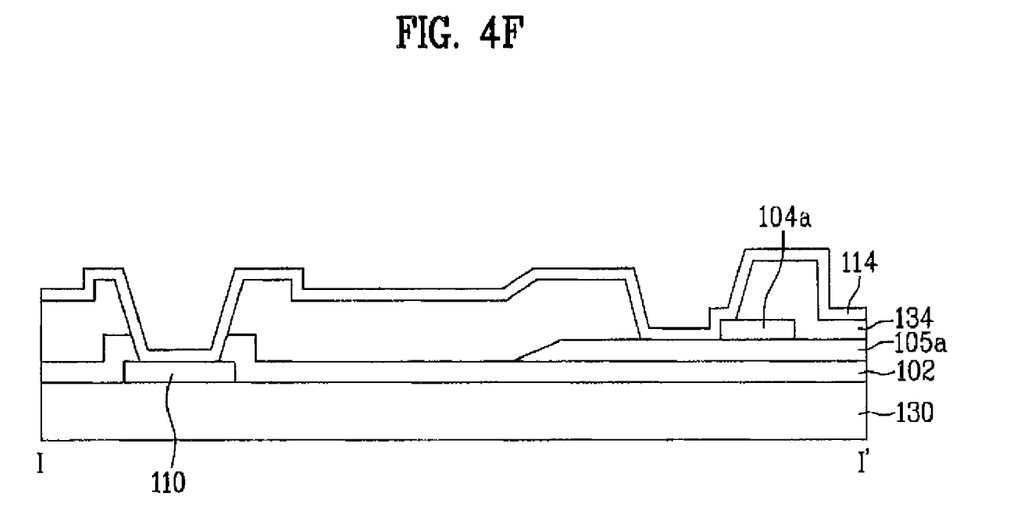

FIG. 3 is an enlarged plan view illustrating a jumper 120 of different conductive layers included in the gate drive IC of FIG. 1, and FIG. 4F is a sectional view illustrating the jumper 120 taken along the line I-I' shown in FIG. 3.

The gate drive IC shown in FIGS. 3 and 4F includes the jumper 120 connected with the plurality of thin-film transistors, and in turn, the jumper 120 includes a bridge electrode 114 to connect the gate conductive layer 110 which protrudes from the plurality of thin-film transistors, and the drain conductive layer 104, with each other. Here, the present invention is not limited to the configuration wherein the jumper 120 is connected with the plurality of thin-film transistors, and is applicable to all configurations wherein a gate conductive layer and a source or drain conductive layer are connected with each other via a bridge electrode on a thin-film transistor substrate.

Although not shown in the drawings, the thin-film transistor includes a gate electrode, a semiconductor layer overlapped with the gate electrode with a gate insulating layer interposed therebetween, and source and drain electrodes overlapped with the semiconductor layer and spaced apart from each other by a predetermined distance. The thin-film transistor corresponds to any one of the plurality of thin-film transistors T1 to T7 shown in FIG. 2.

The jumper 120 includes a gate conductive layer 110 protruding from the thin-film transistor, a drain conductive layer 104a and a semiconductor layer 105a, first and second contact holes 140a and 140b to expose the gate conductive layer 110 and the drain conductive layer 104a, respectively, and the bridge electrode 114 to connect the gate conductive layer 110 and the drain conductive layer 104a by way of the first and second contact holes 140a and 140b.

The gate conductive layer 110 is formed on the insulating substrate 130, and a gate insulating layer 132 is formed on the gate conductive layer 110. The semiconductor layer 105a and the drain conductive layer 104a are formed on the gate insulating layer 132, and a pasivation layer 134 is formed over the semiconductor layer 105a and the drain conductive layer 104a. The first contact hole 140a penetrates the pasivation layer 134 and the gate insulating layer 132 to expose a part of the gate conductive layer 110, and the second contact hole 140b penetrates the pasivation layer 134 to expose a part of the drain conductive layer 104a. The bridge electrode 114, which is formed of a transparent conductive layer on the pasivation layer 134, is connected with the gate conductive layer 110 by way of the first contact hole 140a, and is also connected with the drain conductive layer 104a and the semiconductor layer 105a by way of the second contact hole 140b. Meanwhile, the bridge electrode 114 is formed on the pasivation layer 134 which has improved step coverage via removal of a source conductive layer and thus, can prevent wire breakage. In this case, the removal of the source conductive layer is carried out using a diffraction-exposure mask during patterning of the semiconductor layer and the source and drain conductive layers.

Here, instead of the diffraction-exposure mask, a half-tone mask, in which a diffraction-exposure part of the diffraction-exposure mask is replaced with a half-tone transmission part, may be employed. Hereinafter, only a diffraction-exposure mask will be described.

FIGS. 4A to 4F illustrate a flow chart illustrating a process for forming the jumper 120 having the above-described configuration shown in FIG. 4F.

Although the formation of the jumper 120 is carried out simultaneously with the formation of the plurality of thin-film transistors shown in FIG. 2, FIGS. 4A to 4F omit the formation of the thin-film transistors, and illustrate only the formation of the jumper 120.

As shown in FIG. 4A, the gate conductive layer 110 of the jumper 120 is formed on the insulating substrate 130. Specifically, the gate conductive layer 110 is formed by forming a first conductive layer on the insulating substrate 130 via a deposition method such as sputtering, etc., and patterning the first conductive layer via a photographic etching process using a first mask.

Subsequently, as shown in FIG. 4B, the gate insulating layer 102 as a first insulating layer, a semiconductor layer 105 as a second conductive layer, and a third conductive layer 104 are sequentially formed on the insulating substrate 130 which has been formed with the gate conductive layer 110.

Next, as shown in FIG. 4C, a photoresist pattern 132 is formed on the insulating substrate 130, to define the semiconductor layer and source/drain conductive layers of the jumper 120. The photoresist pattern 132 is formed by forming a photoresist on the third conductive layer 104, and performing a photographic process using a second mask 135 on the photoresist. Here, the second mask 135 is a diffraction-exposure mask consisting of a transmission region 135a to transmit all light, a diffraction-exposure region 135b including a plurality of slits to transmit some light while blocking the remaining light, and a shading region 135c to block light. In this case, the diffraction-exposure region 135b corresponds to a region where the semiconductor layer of the jumper 120 will be defined, and the shading region 135c corresponds to a region where the drain conductive layer of the jumper 120 will be defined. As will be understood, the region where the semiconductor layer will be defined is adjacent to the gate conductive layer 110. Accordingly, a thickness of the photoresist pattern 132 formed on the diffraction-exposure region 135b is smaller than a thickness of the photoresist pattern 132 formed on the shading region 135c.

Then, as shown in FIG. 4D, the semiconductor layer 105a and the drain conductive layer 104a of the jumper 120 are formed on the insulating substrate 130. The semiconductor layer 105a and the drain conductive layer 104a are formed by selectively etching the semiconductor layer 105 and the third conductive layer 104 using the photoresist pattern 132 as a mask. More specifically, the semiconductor layer 105 and the third conductive layer 104 are selectively etched by using the photoresist pattern 132, formed in the diffraction-exposure region 135b and the shading region 135c. And the photoresist pattern 132 is ashed so that the photoresist pattern 132 remains on the the shading region 135c. A part of the third conductive layer 104 formed on the semiconductor layer 105a is etched so that the third conductive layer 104 remains in the shading region 135c using the remained photoresist pattern 132 as a mask to form the drain conductive layer 104a. Accordingly, during patterning of the semiconductor layer 105a and the source/drain conductive layers 104a using the photoresist pattern 132 defined by the diffraction-exposure region 135b of the second mask 135, the source conductive layer adjacent to the gate conductive layer 110 is removed.

Next, as shown in FIG. 4E, the pasivation layer 134 as a second insulating layer is formed on the insulating substrate 130 from which the source conductive layer has been removed. The pasivation layer 134 and the gate insulating layer 102 have the first contact hole 140a configured to expose the gate conductive layer 110, and the pasivation layer 134 has the second contact hole 140b configured to expose the drain conductive layer 104a and the semiconductor layer 105a.

The pasivation layer 134, having the first and second contact holes 140a and 140b, is formed by depositing a pasivation layer on the insulating substrate 130 including the semiconductor layer 105a and the drain conductive layer 104a, and patterning the pasivation layer via a photographic etching process using a third mask.

With the removal of the source conductive layer adjacent to the gate conductive layer 110, the pasivation layer 134 deposited over the gate conductive layer 110 can obtain improved step coverage at a stepped portion of the layer stacking configuration.

Thereafter, as shown in FIG. 4F, a transparent conductive layer 114 as a fourth conductive layer is formed on the insulating substrate 130. The transparent conductive layer 114 is formed by depositing the fourth conductive layer, made of a transparent material, on the insulating substrate 130 formed with the pasivation layer 134, and patterning the fourth conductive layer via a photographic etching process using a fourth mask. The transparent conductive layer 114 is a bridge electrode, which is connected with the gate conductive layer 110 by way of the first contact hole 140*a* and is also connected with the drain conductive layer 104*a* by way of the second contact hole 140*b*. Accordingly, the transparent conductive layer 114 is formed on the pasivation layer 134, which exhibits improved step coverage by virtue of the removal of the source conductive layer, and can prevent wire breakage.

As apparent from the above description, the present invention provides a method for fabricating a liquid crystal display device, in which a source conductive layer adjacent to a gate conductive layer is removed during patterning of source/drain conductive layers and a semiconductor layer using a photoresist pattern defined by a diffraction-exposure region of a mask. With the removal of the source conductive layer, a transparent conductive layer can be formed on a pasivation layer exhibiting improved step coverage. As a result, the present invention has the effect of preventing wire breakage in the transparent conductive layer that connects the gate conductive layer and the drain conductive layer with each other.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a liquid crystal display device, comprising:
   forming a first conductive layer on an insulating substrate;
   forming a first insulating layer, a second conductive layer, and a third conductive layer on the first conductive layer;
   patterning the second conductive layer and the third conductive layer, such that the third conductive layer is located only on a partial region of the second conductive layer;
   forming a second insulating layer on the patterned third conductive layer;
   forming a first contact hole to expose the first conductive layer by patterning the first and second insulating layers, and a second contact hole to expose the third conductive layer by patterning the second insulating layer; and
   forming a fourth conductive layer to connect the first and third conductive layers with each other by way of the first and second contact holes.

2. The method according to claim 1, wherein the step of patterning the second and third conductive layers comprises:
   preparing a diffraction-exposure mask including a transmission region, a shading region and a diffraction-exposure region;
   forming a photoresist on the third conductive layer;
   forming a photoresist pattern by performing a photographic process, using the diffraction-exposure mask, on the photoresist, so that the photoresist pattern remains on the shading region and the diffraction-exposure region;
   etching the second conductive layer and the third conductive layer using the photoresist pattern as a mask;
   ashing the photoresist pattern so that the photoresist pattern remains on the shading region; and
   etching the third conductive layer using the remained photoresist pattern as a mask.

3. The method according to claim 1, wherein a jumper, including the fourth conductive layer to connect the first and third conductive layers with each other, is formed on a thin-film transistor substrate including an image display part constituted of a plurality of pixel regions and a drive circuit to drive the image display part,
   the image display part includes pixel electrodes formed on the respective pixel regions, thin-film transistors connected with the pixel electrodes, gate lines to control the thin-film transistors, and data lines to supply data to the thin-film transistors, and
   the drive circuit includes a gate drive circuit to drive the gate lines.

4. The method according to claim 3, wherein the first conductive layer is a gate conductive layer formed on an insulating substrate, the second conductive layer is a semiconductor layer formed on the first insulating layer, the third conductive layer is a drain conductive layer formed on the semiconductor layer, and the fourth conductive layer is a transparent conductive layer formed on the drain conductive layer.

* * * * *